United States Patent

Zhou et al.

Patent Number: 6,132,646
Date of Patent: Oct. 17, 2000

[54] POLMERIZABLE FLUXING AGENTS AND FLUXING ADHESIVE COMPOSITIONS THEREFROM

[75] Inventors: Zhiming Zhou, Maplewood, Minn.; Miguel A. Capote, Carlsbad, Calif.

[73] Assignee: Miguel Albert Capote, Carlsbad, Calif.

[21] Appl. No.: 09/372,709

[22] Filed: Aug. 11, 1999

Related U.S. Application Data

[62] Division of application No. 08/897,968, Jul. 21, 1997, Pat. No. 5,985,043.

[51] Int. Cl.[7] .................................................. H01B 1/02
[52] U.S. Cl. ........................ 252/512; 252/513; 252/514; 252/500; 252/519.32; 520/25
[58] Field of Search ................................... 252/512, 513, 252/514, 519.32–519.33, 500; 520/25, 1; 148/24

[56] References Cited

U.S. PATENT DOCUMENTS

| | | | |
|---|---|---|---|
| 3,877,978 | 4/1975 | Kremen et al. | 210/23 |
| 3,944,123 | 3/1976 | Jacobs | 128/223 |
| 4,133,525 | 1/1979 | Stayner et al. | 148/23 |
| 4,342,607 | 8/1982 | Zado | 148/23 |
| 4,432,607 | 2/1984 | Levy | 350/96.34 |
| 4,613,660 | 9/1986 | Goel et al. | 528/73 |
| 4,988,395 | 1/1991 | Taguchi et al. | 148/23 |
| 5,011,546 | 4/1991 | Frazier et al. | 148/23 |
| 5,088,189 | 2/1992 | Brown | 29/840 |
| 5,118,364 | 6/1992 | Frazier | 148/23 |
| 5,120,371 | 6/1992 | Boplden et al. | 134/40 |
| 5,128,746 | 7/1992 | Pennisi et al. | 357/72 |
| 5,136,365 | 8/1992 | Pennisi et al. | 357/72 |
| 5,167,729 | 12/1992 | Takemoto et al. | 148/23 |
| 5,177,134 | 1/1993 | Mullen, III et al. | 524/284 |
| 5,196,070 | 3/1993 | Ables et al. | 148/23 |
| 5,281,281 | 1/1994 | Stefanowski | 148/23 |
| 5,297,333 | 3/1994 | Kusaka | 29/840 |
| 5,334,260 | 8/1994 | Stefanowski | 148/23 |
| 5,376,403 | 12/1994 | Capote et al. | 427/96 |
| 5,417,771 | 5/1995 | Arita et al. | 148/23 |
| 5,478,700 | 12/1995 | Gaynes et al. | 430/315 |
| 5,497,938 | 3/1996 | McMahon et al. | 228/253 |
| 5,538,789 | 7/1996 | Capote et al. | 428/344 |
| 5,545,465 | 8/1996 | Gaynes et al. | 428/209 |
| 5,565,267 | 10/1996 | Capote et al. | 428/344 |
| 5,571,340 | 11/1996 | Schneider et al. | 148/23 |
| 5,662,262 | 9/1997 | McMahon et al. | 228/56.3 |
| 5,716,663 | 2/1998 | Capote et al. | 427/96 |
| 5,814,401 | 9/1998 | Gamota et al. | 428/343 |

FOREIGN PATENT DOCUMENTS

| | | |
|---|---|---|
| 0620077A1 | 10/1994 | European Pat. Off. . |
| WO97/0754 | 2/1997 | WIPO . |

*Primary Examiner*—Yogendra Gupta
*Assistant Examiner*—D Hamlin
*Attorney, Agent, or Firm*—Burns, Doane, Swecker & Mathis, L.L.P.

[57] ABSTRACT

A thermally curable adhesive composition that includes a fluxing agent that also acts as an adhesive is provided. The composition includes: (a) a fluxing agent represented by the formula RCOOH, wherein R comprises a moiety having two or more carbon—carbon double bonds; (b) optionally, an effective amount of a crosslinkable diluent; (c) optionally, an effective amount of a source of free radical initiators; and (d) optionally, an effective amount of a resin to react with remnant carboxylic acid moieties. The composition can be applied directly onto the surface(s) of devices that are to be joined electrically and mechanically. These devices include, printed circuit substrates, connectors, components, cables, and other electrical devices having metallization patterns to be soldered together by means of a solder-bumped pattern on one or both surfaces. Alternatively, a solder paste, comprising solder powder mixed with the fluxing agent of the present invention can be used. During the reflow step, the fluxing agent promotes wetting of the solder to the metallization patterns and, simultaneously, the fluxing agent itself crosslinks to mechanically bond and encapsulate the surfaces and their metallizations. The compositions can also be used to formulate sinterable conductive inks.

26 Claims, 2 Drawing Sheets

# POLMERIZABLE FLUXING AGENTS AND FLUXING ADHESIVE COMPOSITIONS THEREFROM

This application is a divisional of application Ser. No. 08/897,968, filed Jul. 21, 1997 now U.S. Pat. No. 5,985,043.

The U.S. Government has a paid-up license in this invention and the right in limited circumstances to require the patent owner to license others on reasonable terms as provided for by the terms of Contract No. N00164-96-C-0089 awarded by the Defense Advanced Research Projects Agency.

FIELD OF THE INVENTION

This invention relates generally to electronic circuits and more particularly to electrical interconnection techniques.

BACKGROUND OF THE INVENTION

In the assembly of electronic components, the solder bump interconnection method was developed to eliminate the expense, unreliability, and low productivity associated with manually wire bonding integrated circuit chips onto carrier or printed circuit substrates. The method utilizes solder bumps deposited on solder-wettable metal terminations on the chip and a matching pattern of solder-wettable terminations on the substrate. In the case of an upside down integrated circuit (flip chip), the flip chip is aligned to the substrate and all the joints are made simultaneously by melting the solder. Typically, the solder bumps are placed on the integrated circuit terminals while the chip is still in wafer form.

To join the integrated circuit to the substrate, a flux, generally a no-clean, low residue flux, is placed on the substrate as a temporary adhesive to hold the integrated circuit in place. The assembly is subjected to a solder melting thermal cycle in an oven or furnace thereby soldering the chip to the substrate. The surface tension of the solder aids to self align the chip to the substrate terminals. After this reflow step, removing the flux residue from under the chip is difficult and requires sophisticated cleaning regimes. This is due, in part, to the close proximity of the chip to the substrate which typically is about 0.001 to 0.006 in. (25.4 to 150 $\mu$m). Therefore with conventional techniques the flux residues are generally left in the space between the chip and the substrate. For this reason, the residues must be inert to prevent subsequent corrosion of the assembly.

The next step in the assembly process is to encapsulate the chip which permits the use of polymeric substrates in flip chip assembly process. Encapsulation can result in significant improvements in the fatigue life of the solder bumps as compared to an unencapsulated flip chip assembly. The technique of underfill encapsulation has gained considerable acceptance by the electronics industry and the materials of choice for underfill encapsulation have been epoxies. Polymeric substrate materials have higher coefficients of thermal expansion than that of a silicon chip, but the expansion coefficients of the underfill encapsulant epoxies can be adjusted with the addition of ceramic fillers to reduce the level of thermal stress that develops between the substrate and the encapsulant.

Most underfill encapsulation procedures involve dispensing liquid encapsulants onto one or more edges of the flip chip assembly. Capillary action draws the encapsulant material through the minute gap between the chip and the substrate. As is apparent, this underfill process can be quite slow due to the small dimensions. The gap must be completely filled and, after the epoxy is cured, be free of voids in order to provide adequate protection for the device and reduce fatigue of the solder joints. The flux residues remaining in the gap reduce the adhesive and cohesive strengths of the underfill encapsulating adhesive.

As is apparent, the multistep assembly process has a number of deficiencies. Furthermore, as the size of chips increases, the limiting effect of capillary action becomes more pronounced and renders the encapsulation procedure even more time consuming. As a result, it is expected that there will be a greater tendency for the epoxy polymer to separate from the ceramic filler during application. In addition, there will be more void spaces.

In an attempt to alleviate these problems associated with flip chip assembly, the industry has employed polymer flux compositions. Prior art polymer flux compositions suitable for assembling electronic components and particularly flip chips generally comprise an elaborate mixture comprising a thermosetting or thermoplastic resin, a flux activator that is generally halogenated, and a chemically protected curing agent which can also function as a fluxing agent. See, for example, U.S. Pat. Nos. 5,088,189, 5,128,746, 5,136,365, 5,167,729, and 5,417,771, and EP 0 620 077 A1.

Prior art flux compositions containing thermosetting resins are undesirable due to their high viscosity and short shelf life which is typically less than one week. Moreover, conventional multi-component fluxing compositions are intrinsically not self-crosslinking. They require resins, such as epoxy resins, for crosslinking thereby further limiting the shelf life or pot life of the material and decreasing flux activity substantially. In addition, chemical protection of the carboxylic acid in the fluxing agent was essential to achieving stability and preventing premature reactions. This results in an acid that is functioning at much less than its full strength with the metal oxides.

As is apparent, the art is in search of more efficient chip assembly techniques that can consistently produce an essentially voidless underfill encapsulation. In particular, there is a need for a soldering flux that can remove oxides and promote soldering without use of ionic or halogen-containing flux activators and that can serve as an adhesive to provide improved bonding at electrical interconnections.

SUMMARY OF THE INVENTION

The present invention is based in part on the discovery of a thermally curable adhesive composition that comprises a fluxing agent that also acts as an adhesive. The composition includes: (a) a fluxing agent represented by the formula RCOOH, wherein R comprises a moiety having two or more carbon—carbon double bonds; (b) optionally, an effective amount of a crosslinkable diluent; (c) optionally, an effective amount of a source of free radical initiators; and (d) optionally, an effective amount of a resin to react with remnant carboxylic acid moieties.

The composition can be applied directly onto the surface (s) of devices that are to be joined electrically and mechanically. These devices include, for example, printed circuit substrates, connectors, components, cables, and other electrical devices having metallization patterns to be soldered together by means of a solder-bumped pattern on one or both surfaces. Alternatively, a solder paste, comprising solder powder mixed with the fluxing agent of the present invention can be used. During the reflow step, the fluxing agent promotes wetting of the solder to the metallization patterns and, simultaneously, the fluxing agent itself crosslinks to mechanically bond and encapsulate the surfaces and their metallizations.

Unlike the polymer flux mixtures of the prior art, the inventive fluxing agent integrates within a single molecule a carboxylic acid group that provides the fluxing action for the soldering process without need of corrosive ions or halogens, and polymerizable carbon—carbon double bonds that can polymerize upon application of heat, with or without the addition of free radical initiators, to form a high-strength solid adhesive polymer. This is accomplished without generating gases, water, or other harmful by-products. Moreover, after the thermally curable adhesive composition is cured, the residues and any remaining fluxing agent do not need to be washed away or removed since they are non-corrosive. Because these residues are located permanently between the two surfaces joined together they do not interfere with test probes.

In a preferred embodiment, the single fluxing agent molecule contains amine groups that are able to moderate the acidity of the carboxylic acid at room temperature by forming a metastable acid-neutralizing salt, thus keeping the flux fresh and highly active despite extended periods of storage or extended periods of contact with reactive metal surfaces.

The inventive thermally curable adhesive composition achieves good flux activity without the need for additional aggressive flux activators. The composition does not evolve gases that can create voids or bubbles in the composition during and after curing. Solvents are not required as the fluxing agent is itself a low viscosity liquid at soldering temperatures.

The adhesive strengths of the cured composition are comparable to the adhesion of copper cladding on FR4 epoxy printed circuit board laminates. Finally, the cured composition becomes a high corrosion resistant adhesive at high temperatures having a glass transition temperature above 150° C. and a coefficient of thermal expansion less than 80 ppm/° C.

BRIEF DESCRIPTION OF THE DRAWINGS

As used herein, like reference numerals will designate similar elements in the various embodiments, wherein.

DETAILED DESCRIPTION OF THE INVENTION

Figure 1:
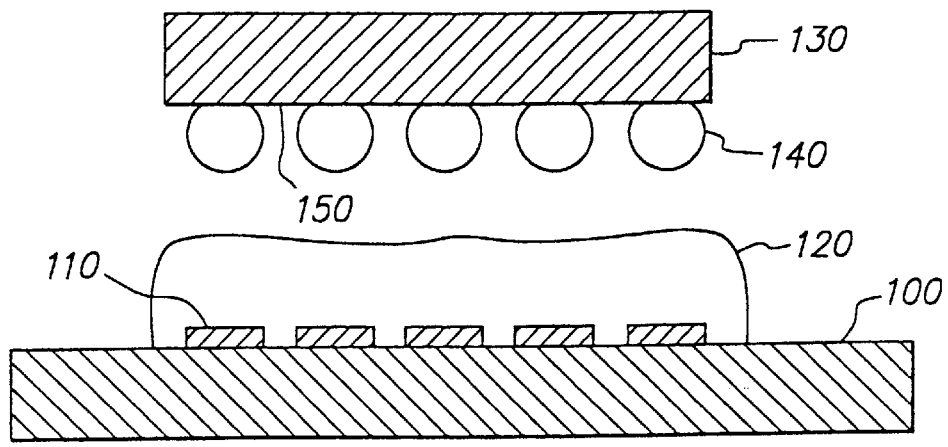
FIGS. 1 and 3 are each a cross sectional view of a device and substrate prior to attachment of the two surfaces to be interconnected.

The invention is directed to fluxing adhesive compositions that include a fluxing agent comprising a single active component which is capable of functioning as both a primary fluxing agent and a crosslinking monomer. Generally, depending upon the intended end use, the inventive thermally curable adhesive composition comprises (a) a fluxing agent having a carboxylic acid group and one or more carbon—carbon double bonds, (b) optionally, a crosslinkable diluent, (c) optionally, a free-radical initiator, and (d) optionally, a resin.

In addition the thermally curable adhesive composition may include a solvent for adjusting the viscosity. Other viscosity modifiers, thickeners and thixotropic agents may also be added. Fillers, such as silica powder, can be employed for increased modulus and lower thermal coefficient of expansion.

1. Fluxing Agents. The fluxing agent has the structure RCOOH, wherein R comprises a moiety which include two or more carbon—carbon double bonds. For high flux activity due to the presence of multiple carboxylic acids, the preferred fluxing agent is a carboxylic acid that is selected from the group consisting of compounds represented by Formulae I, II, III, and IV and mixtures thereof,

HOOCCH=CH(O)COR$^{18}$OC(O)CH=CHCOOH        (I)

R$^2$H$_2$C(HCOR″)$_n$CH$_2$OR$^3$        (II)

[X$^1$X$^2$X$^3$X$^4$]C        (III)

R$^{17}$COOH        (IV)

wherein R$^{18}$ is an alkyl having 1 to 16 carbons, preferably 1 to 9 carbons, and more preferably 1 to 3 carbons, wherein n is an integer from 1 to 16 preferably an integer from 1 to 9, and more preferably an integer from 1 to 3, wherein each of R$^1$, R$^2$, . . . R$^n$, is independently selected from —C(O) CH=CHCOOH, and H, wherein X$^1$, X$^2$, X$^3$, and X$^4$, are each independently selected from —CH$_2$OH and —CH$_2$OC (O)CH=CHCOOH, and wherein R$^{17}$ is a moiety having two or more carbon—carbon double bonds and an amine moiety. The fluxing agent typically comprises about 0.01%–100%, preferably about 5%–80%, and more preferably about 10%–70% by volume of the thermally curable adhesive composition. A particularly preferred fluxing agent which has low-viscosity and high flux activity is tris (maleic acid) glycerol monoester which is described in Example 1.

The fluxing agents of the present invention exhibit flux activities that are superior to that of prior art polymer-fluxing agent mixtures. Since the inventive fluxing agents are intrinsically self-crosslinking, the thermally curable adhesive composition does not require the use of epoxy resins for crosslinking. As a corollary, the shelf life or pot life of the composition is long and its flux activity high relative to conventional polymer-fluxing mixtures that include epoxy resins.

Further, the adhesion properties, mechanical integrity, and corrosion resistance achieved with the fluxing agents are superior to those achieved with prior art polymer fluxing agents because there is no need to add aggressive fluxing activators. The inventive fluxing agents are fully cross-linked and all components thereof are chemically immobilized upon curing. Even the reaction by-products of flux deoxidization of the metals may be chemically bound in the polymer matrix.

Carboxylic acids function well as fluxing agents to remove oxides from metals. In addition, carboxylic acids are also very effective crosslinking moieties when present in their reactive form in a fluxing composition containing a suitable thermosetting resin, such as an epoxy. For this reason, in the prior art, chemical protection of the carboxylic acid was essential to achieving stability and preventing premature reactions. Protection was achieved by binding the fluxing agent with a chemically- or thermally-triggered species so that it becomes reactive only at or near the time that the solder melts. However, with the present invention, no such protection is necessary because the compositions can be formulated without any components that can crosslink with the carboxylic acid moiety. This results in a fluxing agent that can function at its full strength with the metal oxides to produce fluxing that is superior to any heretofore polymerizable fluxing agent. The flux activity of the inventive fluxing agent in some applications may be too high thereby requiring dilution of the fluxing agent to prevent formation of undesirable gaseous by-products.

With the inventive fluxing agent, the principal crosslinking mechanism occurs at the carbon—carbon double bonds existing in the fluxing agent molecule and not at the carboxylic acid groups. The carboxylic acids do not react with the double bonds, therefore on its own, in the absence of other molecules that can react with the carboxylic acid, the fluxing agent does not polymerize at ambient temperatures. It is at elevated temperatures that the double bonds begin to open and react with other opened double bonds to crosslink. Since each fluxing agent molecule contains at least two double bonds, the molecules crosslink into polymeric networks.

By eliminating the need for a separate thermosetting resin in the flux composition, as is required in the prior art, the flux activity can be kept very high without concern about prematurely cross-linking the thermosetting resin. By crosslinking the fluxing agent itself, an adhesive having a higher glass transition temperature and lower coefficient of thermal expansion can be created without sacrificing fluxing activity.

A preferred embodiment of the fluxing agent has an amine moiety that is incorporated into the fluxing agent molecule itself. The generalized structure for carboxylic acids containing two or more carbon—carbon double bonds and also containing an amine is:

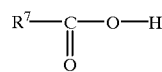

in which $R^7$ comprises at least one amine group and two carbon—carbon double bonds. For high flux activity due to the presence of multiple carboxylic acids, the presently preferred carboxylic acids containing double carbon—carbon bonds has the general structure:

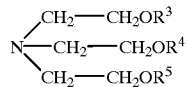

where $R^3$, $R^4$, and $R^5$ are either —H or —OCCH=CHCOOH. For its low viscosity and high flux activity, a particularly preferred amine containing fluxing agent is tris (maleic acid) triethanolamine monoester which is described in Example 2.

The fluxing agent molecules having an amine moiety can moderate each other without the addition of a separate component, as illustrated here:

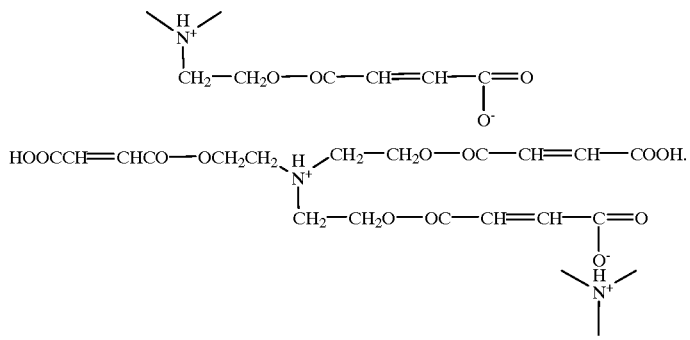

The net result of this moderating mechanism is to cause the fluxing agent to gel at room temperature. Yet, as the temperature is elevated above approximately 50–100° C., these materials will liquefy readily to a low viscosity liquid, indicating the thermal disassociation of these ionic bonds. Thus the carboxylic acid moiety is then fully discharged to flux the oxidized metal surfaces at temperatures above 50–100° C.

Fluxing agents that do not contain nitrogen (e.g., amine) as represented, for example, by Formulae I, II, III, and IV, typically are liquid at ambient temperatures (~23° C.). Therefore, no solvent is required. In contrast, amine containing fluxing agents are solid or semi-solid at ambient temperatures and form gels with the addition of water or other solvent. Thus, by employing both amine and non-nitrogen containing fluxing agents and optionally including a solvent, a thermally curable adhesive composition having the consistency of a tacky gel mixture can be formulated. With the present invention, thermally curable adhesive compositions can be formulated to be in the liquid, gel, or solid state.

2. Diluents. The presence of carbon—carbon double bond(s) in the fluxing agent molecule allows much flexibility in the formulation of a flux composition with exceptional thermomechanical properties. This is achieved by the addition of double bond containing diluents that can also crosslink with the flux to create a superior adhesive. This technique permits the design of fluxing adhesive compositions that can attain high crosslink densities, which are desirable for good thermomechanical properties and good adhesion. Moreover, this is accomplished without the concern of premature crosslinking and reduced pot life associated with the prior art. Preferred diluents include, for example, (a) penta eryethritol tetraacrylate, $C(CH_2OOCCH=CH_2)_4$, (b)triallyl-1,3,5-triazine-2,4,6(1H, 3H,5H)-trione, (c) tris[2-(acryloxy)ethyl]isocyanurate, and mixtures thereof. Diluents (b) and (c) have the following structures:

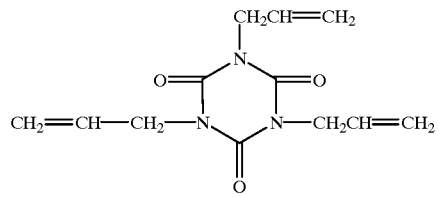

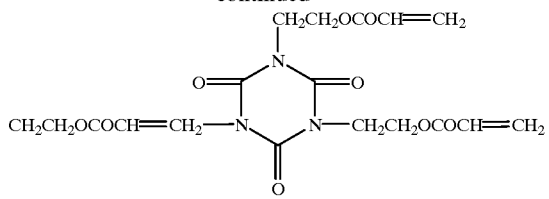

Other double bond compounds, many of which are commercially available, including, for example, diallyl phthalate and divinyl benzene can also be used. Hydrophobic diluents as described are preferred but hydrophilic diluents can also be employed when appropriate. The diluent when employed typically can comprise up to about 90%, preferably between about 5%–80%, and more preferably between about 50%–80% by volume of the thermally curable adhesive composition.

One benefit of employing hydrophobic diluents is that their presence tends to reduce the amount of water which the cured adhesive composition will absorb. The reason is that the fluxing agent, when crosslinked, will have active carboxylic groups that can attract water, even though these carboxylic groups, being part of a network, are immobile. Water acts as a plasticizer which softens the cured adhesive composition. The use of hydrophobic diluents which are crosslinked to the fluxing agent will counteract the hydrophilic effects of the carboxylic acid groups. Indeed, the cured adhesive compositions containing hydrophobic diluents can have less than 2% (wt) moisture when exposed to ambient conditions.

3. Free Radical Initiators. While the thermally curable adhesive composition can be cured using heat alone, the cross linking reaction can be initiated and facilitated by the presence of free-radicals, including, for example, those generated by benzoyl peroxide, butyl hydroperoxide, 2,2'-azobisisobutyronitrile, and mixtures thereof. These free radical initiators or sources are commercially available.

Free-radicals can be created in-situ by exposure of the free-radical initiator to heat, radiation, or other conventional energizing sources. Introduction of an appropriate free-radical initiator can accelerate the onset of crosslinking to the desired moment in a solder reflow operation. The presence of a small amount of free-radical crosslinking initiator in the fluxing agent can be used to control the rate and the temperature of crosslinking of the fluxing agent, ensuring effective fluxing action and strong adhesion of the fluxing agent to the substrates upon curing.

The free radical initiator when employed typically comprises up to about 5%, preferably between about 0%–3%, and more preferably about 0.3%–1% by weight of the thermally curable adhesive composition.

4. Resins. The thermally curable adhesive composition does not require resins; further, compositions that do not include resins tend to have longer pot lives and lower viscosities during solder reflow. However, as an option, a resin can be employed and it functions to increase the adhesion of the cured composition to the substrate and to increase the cohesive strength and glass transition temperature of the cured composition. The resin may be any suitable resin that is compatible (i.e., blendable) with the fluxing agent. By blendable is meant that the resins do not have to be chemically bonded to the fluxing agent and/or diluent, however, preferred resins can crosslink with the carboxylic acid groups in the fluxing agent or by other reactive moieties, such as optional -OH groups, in the diluent. Resins which meet these requirements include, but are not limited to, epoxies, phenolics, novalacs (both phenolic and cresolic), polyurethanes, polyimides, bismaleimides, maleimides, cyanate esters, polyvinyl alcohols, polyesters, and polyureas. Preferred resins 1,4-cyclohexanedimethanol diglycidyl ether, 3,4-epoxycyclohexylmethyl 3,4-epoxycyclohexanecarboxylate, N,N-diglycidyl4-glycidyloxyanilline, bisphenol A based epoxy resins, and mixtures thereof. These are commercially available.

Suitable compounds (including polymers) can also be modified to form resins that are blendable with the diluent and/or the carboxylic acid fluxing agent. Examples of such compounds are acrylics, rubbers (butyl, nitrile, etc.), polyamides, polyacrylates, polyethers, polysulfones, polyethylenes, polypropylenes, polysiloxanes, polyvinyl acetates/polyvinyl esters, polyolefins, cyanoacrylates, and polystyrenes. Generally, any compound can function as a resin if it can be modified to contain at least one of the following illustrative functional groups that act as reactive sites for polymerization: anhydrides, carboxylic acids, amides, amines, alcohols/phenols, nitriles, carbamates, isocyanates, sulfonamides, semicarbazones, oximes, hydrazones, cyanohydrins, ureas, phosphoric esters/acids, thiophosphoric esters/acids, phosphonic esterslacids, phosphites, phosphonamides, and sulfonic esters/acids. For example, a polyolefin which has no reactive sites for binding and has poor adhesive properties is typically not a suitable resin, however, a carboxylated polyolefin functions well when matched with a suitable cross-linking agent. A combination of these and other resins, such as non-cross-linkable thermoplastic resins, may also be used as resins. Resins when employed can comprise up to about 80%, preferably between about 10%–80%, and more preferably about 60%–70% by volume of the thermally curable adhesive composition.

In preparing the fluxing composition, the proportions of the four components may be varied over a considerable range and still yield acceptable fluxing activity as well as good post cured material properties. Preferably, the fluxing composition employed does not produce gaseous byproducts that can result in the formation of bubbles in the final cured composition. This can be achieved with thermally curable adhesive compositions preferably formulated as follows:

a) Fluxing agent comprising about 5%–80% (vol) of the composition;
b) Diluent comprising about 5%–80% (vol) of the composition;
c) Free radical initiator comprising about 0%–3% (wt) of the composition; and
d) Resin comprising about 0%–80% (vol) of the composition.

Some of the thermally curable adhesive compositions within these ranges may exhibit undesirably high moisture absorption, low glass transition temperatures, or high coefficients of thermal expansions after cured, but they remain useful as fluxing compositions in applications where these characteristics are not critical.

Most preferably, the thermally curable adhesive composition after being cured has a coefficient of thermal expansion of about 25 ppm/° C., a glass transition temperature in excess of 150° C. and moisture content of less than 2%. These characteristics can be achieved with thermally curable adhesive compositions preferably formulated without any free radical initiator or resin but comprising about 10%–70% (vol) fluxing agent and about 20%–80% (vol) diluent.

While, again, some of the fluxing agents within these ranges may exhibit high coefficient of thermal expansion or low glass transition temperature when cured, they remain useful as fluxes in applications where these characteristics are not critical.

In order for the thermally curable adhesive composition to achieve the largest spreading and wetting by the solder, it must achieve and maintain low viscosity up to the temperature at which the solder melts and wets the metallizations. If the composition becomes too thick before the solder has melted, it will impede the flow of the solder melt and reduce the degree of metal soldering. For this reason, the curing of the composition must occur slowly relative to the time required to reach the melting point of the solder powder. This can be achieved by selection of the components with appropriate crosslinking temperatures and formulating the appropriate proportions by use of a differential scanning calorimeter to control reaction rates and times.

The thermally curable adhesive composition can also be used as a fluxing adhesive for use in sinterable conductive ink compositions that comprises:

a) 1% to 65% (wt) of a high melting point metal or metal alloy powder, typically comprising Cu powder, however, other metals such as, for example, Ag, Au, Pt, Pd Be, Rh, Ni, Co, Fe, Mo, and high-melting point alloys thereof;

b) 6% to 65% (wt) of a low melting point metal or metal alloy powder (solder), typically comprising Sn, Bi, Pb, Cd, Zn, Ga, In, Hg, Sb, or an alloy thereof or other metal having a melting point that is lower than that of the high melting metal powder in part (a); and c) 5% to 50% (wt) of the thermally curable adhesive flux composition that also serves a flux composition and as an adhesive.

Preferably the conductive ink composition comprises 13% to 65% (wt) of the high melting point metal, 6% to 29% (wt) of the low melting point metal, and/or 5% to 35% (wt) of the thermally curable adhesive flux composition.

Techniques for employing electrically conductive compositions are described in U.S. Pat. Nos. 5,376,403, 5,538,789, and 5,565,267 which are incorporated herein. During the curing process of the sinterable conductive ink compositions, in order for the solder alloy to readily wet the other powder and sinter, the principal requirement of the thermally curable adhesive composition is that the polymers not harden before melting of the solder powder is achieved. Additionally, after curing, the composition must act as an adhesive that strongly binds the cured ink composition to the printed circuit board substrate. The flux compositions of the instant invention are particularly suited for these applications.

METHODOLOGY

The thermally curable adhesive composition of the instant invention is particularly suited for attaching flip chips to a substrate wherein the fluxing agent serves also as an encapsulating adhesive. The compositions eliminate the need for the additional assembly steps of washing the solder flux and then underfilling the chip-to-substrate gap with an encapsulating polymer adhesive, as is done in the prior art.

An improved flip-chip process involves a single-step chip placement followed by solder reflow without the labor intensive underfill encapsulation steps. This improved process is possible if, prior to soldering, the bumped chips or substrate can be coated with a thick layer of the instant invention fluxing composition so that it effectively fluxes the soldering of the interconnections then also hardens to form the solid encapsulant after soldering. The heat applied during the solder reflowing operation will also harden the adhesive to create a high-strength bond.

Attachment of a substrate to a device is illustrated in FIG. 1 wherein a flip chip 130 containing solder bumps 140 is positioned so that the solder bumps 140 and the active surface 150 are facing the substrate 100 and aligned with the metallization pattern 110 of the substrate 100. The thermally curable adhesive flux composition 120 is coated on the surface of the substrate and metallization pattern.

Figure 2:
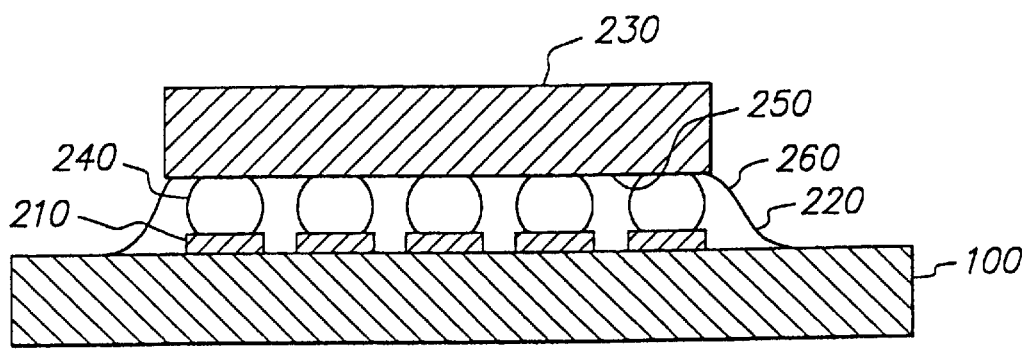
FIGS. 2 and 5 are each a cross sectional view of the device and substrate surfaces after bonding.

Referring to FIG. 2, the bumped chip 230 is moved into intimate contact with the metallization pattern 210. The thermally curable adhesive flux composition 220 wets the chip 230, insuring complete coverage of the active surface 250 of the chip 230. The fillet 260 provides a continuous seal around the periphery of the chip 230 to protect the active surface 250 from environmental contamination. The fluxing agent contained in composition 220 coats the solder bumps 240 and the metallization pattern 210.

The assembly 270 is reflowed in a conventional manner such as in an oven, causing the carboxylic acid in the fluxing agent of the composition to become reactive, reducing the oxides on the solder 240 and the metallization surface 210, and permitting alloying of the solder to the metal. After the reflow process, the fluxing agent in composition 220 and the other crosslinkable carbon—carbon double bonds in the composition, if present, crosslink to one another, hardening the composition to a solid form. Depending on the composition, a second hardening operation may be required by application of additional heat to completely harden the composition 220. During the reflow and hardening steps, the assembly is encapsulated by the composition. Since the encapsulant provides a continuous seal to protect the active surface 250 from environmental contamination, no further cleaning or encapsulating operations are required.

It should be appreciated that although the drawings depict the encapsulation and connection of a flip chip 130 to a substrate, embodiments using other types of surface mounted components, cables, or connectors having solder bumps are within the scope of the invention. Similarly, instead of solder bumps, a solder paste comprising a solder powder and the thermally curable adhesive composition can be employed. Suitable solder powders comprise, for example, tin/lead, tin/lead/silver, and tin/lead/antimony solder powders. The inventive thermally curable adhesive composition is also suitable for soldering and mechanically attaching a flat cable to a printed circuit or flat panel display without the need for a separate connector.

Figure 3:
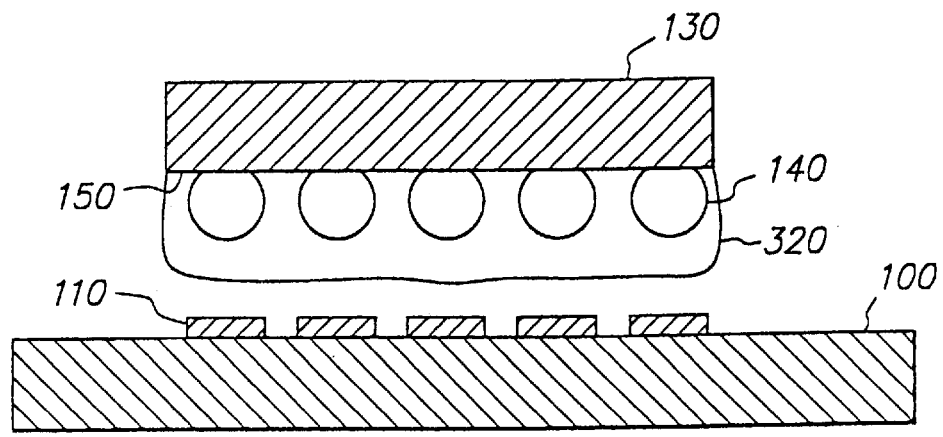
Figure 4:
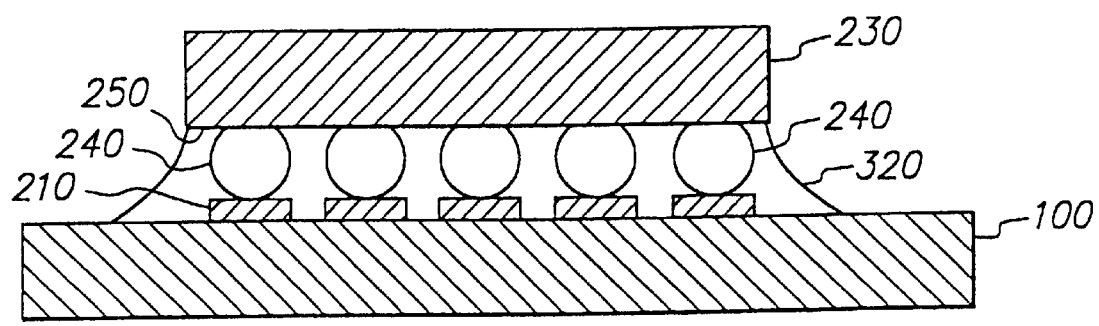
FIG. 4 is a cross sectional view of a flip chip temporarily attached without solder reflow for testing or burn in prior to reflow.
Figure 5:
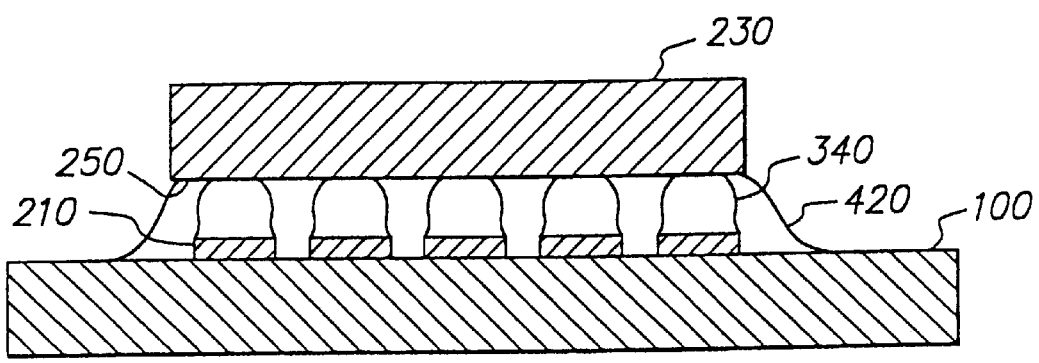

Another assembly technique involves formulating a curable adhesive composition which is solid at room temperature, but melts without crosslinking at an elevated temperature. Such a formulation can be made by employing a solid fluxing agent such as tris (maleic acid) triethanolamine monoester, which is solid at room temperature, but flows readily when heated to 90–100° C. without crosslinking. As shown in FIG. 3, the molten curable adhesive composition 320 can be first applied to the solder bumped chip 130 and allowed to cool and harden to form a chip/adhesive/bump subassembly. This subassembly can be applied to the substrate 100 with or without addition of any other flux. A small amount of heat may be used to soften the composition 320 so that it holds the chip 230 in place until the solder is reflowed as shown in FIG. 4. If allowed to cool, this molten composition 320 can temporarily support the chip 230 in place for chip testing or burn in. The chip can thus be easily removed should it malfunction. When it is desired to permanently attach the chip, the substrate and subassembly can be passed through a solder reflow oven thereby melting the solder bumps 340, activating the flux in composition 420, forming permanent solder joints, and crosslinking the adhesive in the composition as shown in FIG. 5.

Another approach to the above involves adding a diluent to a mixture of solid and liquid fluxing agent to create a somewhat sticky mixture. The mixture is applied to the chip by warming as described above, then hardened to form a somewhat pressure-sensitive adhesive. Placement of the chip on the substrate will then hold the chip in place until the solder is reflowed.

As is apparent, the thermally curable adhesive composition can be dispensed on the substrate or the chip prior to performing the solder bump reflowing. The novel flip-chip attachment process has a number of advantages. For example, during the reflow operation, the composition also hardens and encapsulates the flip chip assembly. This eliminates the additional steps of reflowing the solder bump and then underfilling and curing the encapsulant that results in reduced production efficiency in prior art processes. In addition, there is no need to underfill any material into the tiny gap in the flip chip assembly. Void formation from the underfilling procedure and separation of the polymer from the ceramic fillers during application in prior art processes are eliminated. The flux residues remaining in the gap are not only rendered harmless, but also become integral to the structure of the final assembly. Finally, there is no longer a size limit on the chip that can be attached.

To achieve these advantages, the inventive thermally curable composition exhibit the following features:

a) provides sufficient flux activity to promote the solder bump to readily wet the metallization on the substrate during solder reflow, without the presence of corrosive flux activators that can contaminate the silicon chip;

b) promotes solder wetting and self-alignment of the chip to the pads on the substrate by action of the wetting force of the molten solder, during the solder reflow cycle, no hardening of the flux composition occurs until the solder bump has been melted;

c) reduces or eliminates gaseous evolution during the reflow cycle that would otherwise create voids;

d) hardens quickly and soon after solder bump melts;

e) demonstrates little shrinkage of the composition during hardening to minimize the stress resulting from the hardening process and subsequent cooling; and f) forms strong adhesion of the cured composition to the chip, substrate and solder joints.

EXPERIMENTAL

EXAMPLE 1

Preparation of tris (maleic acid) glycerol monoester, a non-anine fluxing agent with the structure:

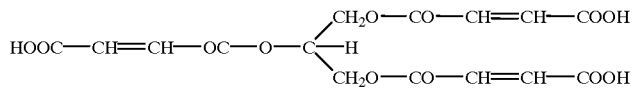

Three moles of maleic anhydride (294 grams) were heated in a flask at 80° C. until fully melted at which time one mole of glycerol (92 grams) was slowly added thereto. The composition was constantly stirred and maintained at 80° C. for three hours. The temperature was then raised to 110° C. for one hour to complete the reaction. Thereafter the product was allowed to cool to room temperature. The reactants were kept in a nitrogen atmosphere throughout. Monitoring the reaction on a Fourier-transform infrared spectrometer, the OH vibrational band at 3,400–3,500 cm$^-$ of the glycerol was observed to become minimized while an ester vibration band at 1,710–1,740 cm$^-$ appeared and maximized, indicating complete reaction of the glycerol and the anhydride. This fluxing agent is characterized by its low viscosity and high flux activity.

EXAMPLE 2

Preparation of tris (maleic acid) triethanolamine monoester: an amine fluxing agent, with the structure:

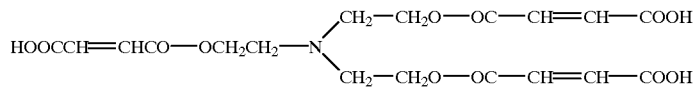

Three moles of maleic anhydride (294 grams) were heated in a flask at 80° C. until fully melted at which time one mole of triethanolamine (149 grams) was slowly added thereto over the course of one hour, so that gelation did not occur. The composition was constantly stirred and maintained at 80° C. To ensure 20 that the reaction went to completion, the product was maintained at 80° C. with constant stirring for an additional hour. The reactants were kept in a nitrogen atmosphere throughout. Then the product was allowed to cool to room temperature. Monitoring the reaction on a Fourier-transform infrared spectrometer, the OH vibrational band at 3,400–3,500 cm$^-$ of the triethanolamine was observed to become minimized while an ester vibration band at 1,710–1,740 cm$^{-1}$ appeared and maximized, indicating complete reaction of the triethanolamine and the anhydride.

This fluxing agent is also characterized by its low viscosity and high flux activity.

EXAMPLE 3

Preparation of Methyl Meso-Erythritol Tetramaleic Acid Monoester 39 g maleic anhydride was heated to 80° C. until all the maleic anhydride was melted before 12.2 g of meso-erythritol was added under mechanical stirring. The temperature was then raised to 130° C. for 30 minutes followed by cooling down to 80–90° C. for 2 hours. The reaction is:

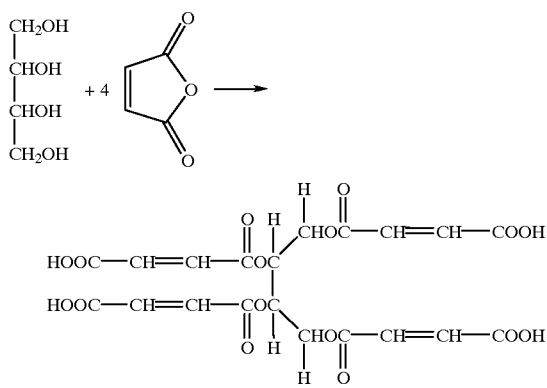

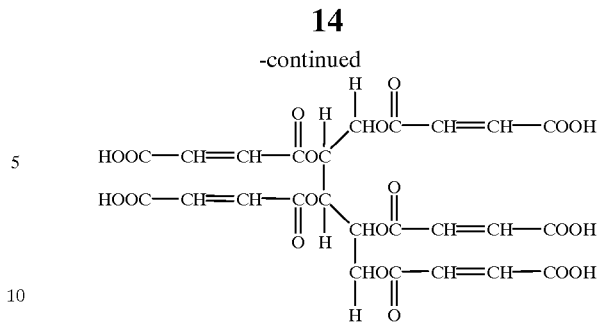

EXAMPLE 4

Preparation of Pentaerythritol Ethoxylate Tetramaleic Acid Monoester 39 g maleic anhydride was heated to 80° C. until all the maleic anhydride was melted before 27 g pentaerythritol ethoxylate (average Mn ca 270) was added under mechanical stirring. The reactants are stirred at 80° C. for 2~3 hours to complete the reaction. The reaction is:

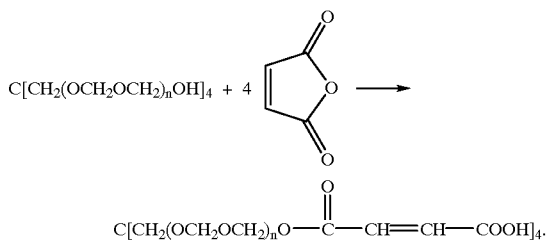

EXAMPLE 5

Preparation of Adonitol Pentamaleic Acid Monoester 49 g maleic anhydride was heated to 80° C. until all the maleic anhydride was melted before 15.2 g of adonitol was added under mechanical stirring. The temperature was then increased to 120° C. for 30 minutes followed by cooling down to 80° C. The reactants were stirred at 80° C. for 3 hours to finish the reaction. The reaction is:

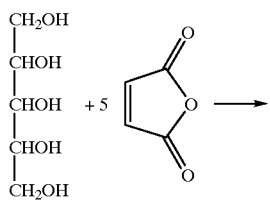

EXAMPLE 6

Physical characteristics of six inventive curable adhesive compositions were measured. The properties tested were solder wettability (spread), glass transition temperature, thermal decomposition temperature, co-efficient of thermal expansion, and adhesion strength (shear). The five inventive compositions were formulated as follows:

| Fluxing Agent | Compositions | | | | | |
|---|---|---|---|---|---|---|
| | 1 | 2 | 3 | 4 | 5 | 6 |
| tris (maleic acid) glycerol monoester | 100% | — | 50% | 70% | — | 35% |
| tris (maleic acid) triethanolamine monoester | — | 100% | 50% | — | 70% | 35% |
| triallyl-1, 3, 5 - triazine-2, 4, 6 (1H, 3H, 5H) trione | - | - | - | 30% | 30% | 30% |

The results are set forth in the following table.

| Composition | Solder Spread (Area) | Glass Transition Temperature Tg (° C.) | Thermal Degradation Temperature (° C.) | CTE (ppm/K) | Adhesive Shear Strength to Copper Surface (MPa) |
|---|---|---|---|---|---|
| A | 1.28 | — | — | — | — |
| 1 | 2.65 | 164 | >350 | 73 | — |
| 2 | 2.58 | 152 | >270 | 73 | — |
| 3 | 2.63 | 156 | >300 | — | 60 |
| 4 | 2.60 | 172 | >320 | 67 | — |
| 5 | 2.56 | 170 | >290 | — | — |
| 6 | 2.60 | 160 | >300 | 75 | — |

Composition A consisted of an adhesive material that is described in U.S. Pat. No. 5,128,746 (Example 4) which contains a fluxing agent and hardener. The composition was prepared with the following components (by weight): 50% Shell Epon 825 epoxy resin (Shell Chemical Co.), 7% malic acid, 42% methylhexahydrophthalic anhydride (MA) and 1% imidazole. The malic acid and the epoxy resin were mixed and heated to about 150° C. with stirring until the solution was clear. The solution was allowed to cool to room temperature before the MA and imidazole were added and the mixture was stirred until uniform.

As is apparent, the inventive compositions yield superior physical properties. The solder spread was measured by placing a ball of solder on a surface and then applying a small amount of the curable adhesive composition (or composition A) to the solder. The surface was then heated to about 200° C. and the area that the melted solder covered was measured. The solder spread values are normalized, that is, the solder spread in the case where no fluxing agent was employed is equal to 1.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An electrically conductive ink composition formed by curing an adhesive composition comprising:
   a) 1 to 65% (wt) of a high melting point metal that is selected from the group consisting of Cu, Ag, Au, Pt, Pd Be, Rh, Ni, Co, Fe, Mo, and alloys thereof;
   b) 6 to 65% (wt) of a solder that is selected from the group consisting of Sn, Bi, Pb, Cd, Zn, Ga, In, Hg, Sb, and alloy thereof; and
   c) 5% to 50% (wt) of the thermally curable adhesive flux composition that comprises:
      (i) a fluxing agent represented by the formula RCOOH, wherein R comprises a moiety having two or more carbon—carbon double bonds;
      (ii) an effective amount of a double bond containing diluent that is capable of crosslinking with the fluxing agent;
      (iii) optionally, an effective amount of a source of free radical initiators; and
      (iv) optionally, an effective amount of a resin.

2. The composition of claim 1 wherein the fluxing agent is selected from the group consisting carboxylic acids selected from the group consisting of compounds represented by Formulae I, II, III, and IV and mixtures thereof, $$HOOCCH=CH(O)COR^{18}OC(O)CH=CHCOOH \qquad (I)$$

$$R^2H_2C(HCOR^n)_nCH_2OR^3 \qquad (II)$$

$$[X^1X^2X^3X^4]C \qquad (III)$$

$$R^{17}COOH \qquad (IV)$$

wherein $R^{18}$ is an alkyl having 1 to 16 carbons, wherein n is an integer from 1 to 16, wherein each of $R^1, R^2, \ldots R^n$, is independently selected from —C(O)CH=CHCOOH, and H, wherein $X^1, X^2, X^3,$ and $X^4$, are each independently selected from —CH$_2$OH and —CH$_2$OC(O)CH=CHCOOH, and wherein $R^{17}$ is a moiety having two or more carbon—carbon double bonds and an amine moiety wherein at least one of the R's of formula (II) is —C(O)CH=CHCOOH, and wherein at least one of the X's of formula (III) is CH$_2$OC(O)CH=CHCOOH.

3. The composition of claim 1 wherein the diluent is selected from the group consisting of pentaerythritol tetraacrylate, triallyl-1,3,5-triazine-2,4 ,6 (1H,3H ,5H)-trione, tris isocyanurate, and mixtures thereof.

4. The composition of claim 1 wherein the source of free radical initiators is selected from the group consisting of benzoyl peroxide, butyl hydroperoxide, 1,2'-azobisisobutyronitrile, and mixtures thereof.

5. The composition of claim 1 wherein the resin is selected from the group consisting of 1,4-cyclohexanedimethanol diglycidyl ether, 3,4-epoxycyclohexylmethyl 3,4-epoxycyclohexanecarboxylate, N,N-diglycidyl-4-glycidyl-oxyanilline, bisphenol A based epoxy resins, and mixtures thereof.

6. The composition of claim 2 wherein the fluxing agent has the structure of Formula I.

7. The composition of claim 2 wherein the fluxing agent has the structure of Formula II.

8. The composition of claim 2 wherein the fluxing agent has the structure of Formula II.

9. The composition of claim 8 wherein $X^1, X^2,$ and $X^3$ are each —CH$_2$OC(O)CH=CHCOOH and $X^4$ is H.

10. The composition of claim 2 wherein the fluxing agent has the structure of Formula IV.

11. The composition of claim 10 wherein the fluxing agent is represented by the formula $[(CH_2CH_2OR^{19})(CH_2CH_2OR^{20})(CH_2CH_2OR^{21})]N$ wherein $R^{19}, R^{20},$ and $R^{21}$ are each independently selected from the —

12. The composition of claim 1 wherein the fluxing agent comprises about 0.01% to 100% by volume, the diluent comprises up to about 90% by volume, the source of free radical initiators comprises about 0% to 5% by weight, and the resin comprises about 0% to 80% by volume of the composition.

13. The composition of claim 1 wherein the fluxing agent comprises about 10% to 70% by volume and the diluent comprises about 50% to 80% by volume of the composition.

14. The composition of claim 2 wherein the fluxing agent comprises about 0.01% to 100% by volume, the diluent comprises about 0% to 90% by volume, the source of free radical initiators comprises about 0% to 5% by weight, and the resin comprises up to about 80% by volume of the composition.

15. The composition of claim 2 wherein the fluxing agent comprises about 10% to 70% by volume and the resin comprises about 10% to 80% by volume of the composition.

16. An electrically conductive ink composition formed by curing an adhesive composition comprising:
   a) 1 to 65% (wt) of a high melting point metal that is selected from the group consisting of Cu, Ag, Au, Pt, Pd Be, Rh, Ni, Co, Fe, Mo, and alloys thereof;
   b) 6 to 65% (wt) of a solder that is selected from the group consisting of Sn, Bi, Pb, Cd, Zn, Ga, In, Hg, Sb, and alloy thereof; and
   c) 5% to 50% (wt) of the thermally curable adhesive flux composition that comprises:
      (i) a fluxing agent represented by the formula RCOOH, wherein R comprises a moiety having two or more carbon—carbon double bonds;
      (ii) an effective amount of a resin;
      (iii) optionally, an effective amount of a source of free radical initiators; and
      (iv) optionally, an effective amount of a double bond containing diluent that is capable of crosslinking with the fluxing agent.

17. The composition of claim 16 wherein the fluxing agent is selected from the group consisting carboxylic acids selected from the group consisting of compounds represented by Formulae I, II, III, and IV and mixtures thereof, $$HOOCCH=CH(O)COR^{18} \; OC(O)CH=CHCOOH \qquad (I)$$

$$R^2H_2C(HCOR^n)_nCH_2OR^3 \qquad (II)$$

$$[X^1X^2X^3X^4]C \qquad (III)$$

$$R^{17}COOH \qquad (IV)$$

wherein $R^{18}$ is an alkyl having 1 to 16 carbons, wherein n is an integer from 1 to 16, wherein each of $R^1, R^2, \ldots R^n$, is independently selected from —C(O)CH=CHCOOH, and H, wherein $X^1, X^2, X^3,$ and $X^4$, are each independently selected from $-CH_2OH$ and $-CH_2OC(O)CH=CHCOOH$, and wherein $R^{17}$ is a moiety having two or more carbon—carbon double bonds and an amine moiety wherein at least one of the R's of formula (II) is $-C(O)CH=CHCOOH$, and wherein at least one of the X's of formula (III) is $CH_2OC(O)CH=CHCOOH$.

18. The composition of claim 16 wherein the diluent is selected from the group consisting of penta erythritol tetraacrylate, triallyl-1,3,5-triazine-2,4,6 (1H,3H,5H)-trione, tris[2-(acryloxy)ethyl]isocyanurate, and mixtures thereof.

19. The composition of claim 16 wherein the source of free radical initiators is selected from the group consisting of benzoyl peroxide, butyl hydroperoxide, 2,2'-azobisisobutyronitrile, and mixtures thereof.

20. The composition of claim 16 wherein the resin is selected from the group consisting of 1,4-cyclohexanedimethanol diglycidyl ether, 3,4-epoxycyclohexylmethyl 3,4-epoxycyclohexanecarboxylate, N,N-diglycidyl-4-glycidyl-oxyanilline, bisphenol A based epoxy resins, and mixtures thereof.

21. The composition of claim 17 wherein the fluxing agent has the structure of Formula I.

22. The composition of claim 17 wherein the fluxing agent has the structure of Formula II.

23. The composition of claim 17 wherein the fluxing agent has the structure of Formula III.

24. The composition of claim 23 wherein $X^1$, $X^2$, and $X^3$ are each $-CH_2OC(O)CH=CHCOOH$ and $X^4$ is H.

25. The composition of claim 17 wherein the fluxing agent has the structure of Formula IV.

26. The composition of claim 25 wherein the fluxing agent is represented by the formula $[(CH_2CH_2OR^{19})(CH_2CH_2OR^{20})(CH_2CH_2OR^{21})]N$ wherein $R^{19}$, $R^{20}$, and $R^{21}$ are each independently selected from the $-OCCH=CHCOOH$, and $-H$.

* * * * *